United States Patent
Qi et al.

(10) Patent No.: US 9,490,123 B2
(45) Date of Patent: Nov. 8, 2016

(54) METHODS OF FORMING STRAINED EPITAXIAL SEMICONDUCTOR MATERIAL(S) ABOVE A STRAIN-RELAXED BUFFER LAYER

(71) Applicant: GLOBALFOUNDRIES Inc., Grand Cayman (KY)

(72) Inventors: Yi Qi, Niskayuna, NY (US); David Paul Brunco, Latham, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/523,334

(22) Filed: Oct. 24, 2014

(65) Prior Publication Data
US 2016/0118255 A1 Apr. 28, 2016

(51) Int. Cl.
| | |
|---|---|
| *H01L 21/20* | (2006.01) |
| *H01L 21/70* | (2006.01) |
| *H01L 21/762* | (2006.01) |
| *H01L 21/36* | (2006.01) |
| *H01L 21/302* | (2006.01) |
| *H01L 21/461* | (2006.01) |
| *H01L 21/02* | (2006.01) |

(52) U.S. Cl.
CPC ... *H01L 21/02664* (2013.01); *H01L 21/02381* (2013.01); *H01L 21/02505* (2013.01); *H01L 21/02532* (2013.01)

(58) Field of Classification Search
CPC .................. H01L 21/02664; H01L 21/02225; H01L 21/02112; H01L 35/26; H01L 21/7624; H01L 21/02378; H01L 21/02381; H01L 21/02532; B82Y 40/00
USPC ....... 438/509, 488, 489, 492, 493, 507, 763, 438/641, 778, 201; 257/17, 501, 502, 65, 257/616
See application file for complete search history.

(56) References Cited

U.S. PATENT DOCUMENTS 6,060,656 A * 5/2000 Dresselhaus ............ H01L 35/26
136/203
2002/0185686 A1* 12/2002 Christiansen ..... H01L 21/02378
257/347

(Continued)

FOREIGN PATENT DOCUMENTS

EP 1588408 B1 6/2014

OTHER PUBLICATIONS

Paul, "Silicon-Germanium Strained Layer Materials in Microelectronics," Advanced Materials, 11:191-204, 1999.

*Primary Examiner* — Duy T Nguyen
*Assistant Examiner* — Brian Turner
(74) *Attorney, Agent, or Firm* — Amerson Law Firm, PLLC

(57) ABSTRACT

One illustrative method disclosed herein includes, among other things, sequentially forming a first material layer, a first capping layer, a second material layer and a second capping layer above a substrate, wherein the first and second material layers are made of semiconductor material having a lattice constant that is different than the substrate, the first material layer is strained as deposited, and a thickness of the first material layer exceeds its critical thickness required to be stable and strained, performing an anneal process after which the strain in the first material layer is substantially relaxed through the formation of crystallographic defects that are substantially confined to the semiconducting substrate, the first material layer, the first capping layer and the second material layer, and forming additional epitaxial semiconductor material on an upper surface of the resulting structure.

8 Claims, 9 Drawing Sheets

(56) References Cited

U.S. PATENT DOCUMENTS

| | | | |
|---|---|---|---|
| 2004/0012075 A1* | 1/2004 | Bedell | H01L 21/76243 257/616 |
| 2004/0248354 A1* | 12/2004 | Chidambaram | H01L 21/02381 438/201 |
| 2006/0035447 A1* | 2/2006 | Ikeda | H01L 21/02381 438/493 |
| 2008/0142844 A1* | 6/2008 | Aulnette | H01L 21/0237 257/191 |
| 2010/0264463 A1* | 10/2010 | Figuet | H01L 21/02381 257/201 |
| 2012/0299155 A1 | 11/2012 | Liu | |

* cited by examiner

METHODS OF FORMING STRAINED EPITAXIAL SEMICONDUCTOR MATERIAL(S) ABOVE A STRAIN-RELAXED BUFFER LAYER

BACKGROUND OF THE INVENTION

1. Field of the Invention

Generally, the present disclosure relates to the manufacture of FET semiconductor devices, and, more specifically, to various methods of forming strained epitaxially grown semiconductor material(s) above a strain-relaxed buffer (SRB) layer.

2. Description of the Related Art

Device manufacturers are under constant pressure to produce integrated circuit products with increased performance and lower production costs relative to previous device generations. As it relates to both planar and 3D devices (such as FinFETs), device designers have spent many years and employed a variety of techniques in an effort to improve the performance capability and reliability of such devices. Device designers are currently investigating using alternative semiconductor materials, e.g., silicon germanium (SiGe), such as so-called III-V materials, etc., in transistor devices to enhance the performance capabilities of such devices. Devices with high charge carrier mobility with silicon, silicon-germanium or germanium channel materials can be fabricated above a strain-relaxed SiGe layer as a "virtual substrate." Ideally, such a virtual substrate needs to have a very smooth surface with a low threading dislocation density (TDD). However, the formation of such a virtual substrate comprised of such alternative materials on silicon substrates (the predominate substrates used in the industry) is a non-trivial matter due to, among other issues, the large difference in lattice constants between such alternative channel materials and silicon.

One prior art technique for forming virtual substrates involves performing an epitaxial growth process to form a relatively thick layer of a semiconductor material ("epitaxial semiconductor material layer"), in either a homogenous or graded condition, above a semiconductor substrate, such as silicon. An epitaxial semiconductor material layer that is formed to a thickness greater than a critical thickness for such a semiconductor material relaxes via the introduction of dislocations into the epitaxial semiconductor material layer. This critical thickness of the epitaxial semiconductor material layer is mainly determined by compositional differences between the epitaxial semiconductor material layer and the substrate, the growth conditions (growth rate, temperature, etc.) and by the defects present in the epitaxial semiconductor material layer and/or at the heterointerface between the epitaxial semiconductor material layer and the underlying substrate. Although reduced threading dislocation densities can be obtained by this method, thick buffer layers still present some major drawbacks, e.g., growth time, material consumption, thermal budget and so on, while typically not achieving required TDD levels.

With respect to forming such lattice-constant-mismatched materials on one another, there is a concept that is generally referred to as the "critical thickness" of a material. Critical thickness is defined as the maximum stable thickness of a completely strained heterostructure material substantially without any misfit dislocations and threading dislocations, which will be described more fully below. FIG. 1A is a graph taken from an article entitled "Silicon-Germanium Strained Layer Materials in Microelectronics" by Douglas J. Paul that was published in *Advanced Materials* magazine (11(3), 191-204 (1999)). The vertical axis is the critical thickness in nanometers. The horizontal axis is the composition of germanium in the silicon-germanium material ($Si_{1-x}Ge_x$; x=0-1). At the leftmost point on the horizontal axis is pure silicon (Ge composition equals 0.0). At the rightmost point on the horizontal axis is pure germanium (Ge composition equals 1.0). The two curves R and S define the stable, metastable and relaxed-with-defects regions for silicon-germanium materials having differing germanium composition levels. Above and to the right of curve R are materials that are in the relaxed-with-defects condition. Below and to the left of curve S are materials that are in the stable condition (i.e., substantially defect-free and in a "fully-strained" condition). The region between the two curves R and S defines the region where materials are in the metastable condition. A material in the metastable condition is not stable, but can still be fully strained and substantially defect-free if grown under the right conditions. However, this metastable material could relax (with the associated defects being formed) relatively quickly when the environment is changed, e.g., when the metastable material is annealed.

With reference to FIG. 1A, a layer of pure germanium (Ge composition equal to 1.0) may be in the stable condition at a thickness up to about 1-2 nm (point CT1) and it may be in a metastable condition for thicknesses between about 2-4 nm (point CT2). Above a thickness of about 4 nm, a layer of pure germanium will be in the relaxed-with-defects condition. In contrast, a layer of silicon-germanium with 50% germanium may be in the stable condition at thicknesses up to about 4 nm (point CT3) and it may be in a metastable condition for thicknesses between about 4-30 nm (point CT4). Above a thickness of about 30 nm, a layer of silicon-germanium with a 50% composition of germanium will be in the relaxed-with-defects condition.

As to dislocations in such SiGe materials, there are at least two types of dislocations worth mentioning—misfit dislocations and threading dislocations. In general, a misfit dislocation occurs where this is a missing or extra lattice between two layers with different lattice constants. In Si/SiGe heterostructures, when SiGe is grown above its critical thickness, misfit dislocations occur due to the mismatch between the lattice constant of the grown material and the silicon substrate. These misfit dislocations will typically be oriented at about 60 degrees when SiGe is grown on a (100) silicon substrate. For each misfit dislocation, there will typically be two threading dislocations, each of which initiates at an end of the misfit dislocation. These threading dislocations move or "thread" their way to the surface of the SiGe material, where they effectively terminate. In other cases, the misfit dislocations can also terminate at an edge of a semiconductor wafer or at other suitable boundaries without the formation of threading dislocations.

FIGS. 1B-1E depict one illustrative prior art technique where alternative channel materials will be formed above the SRB structure. FIG. 1B depicts a device 10 wherein a first silicon germanium layer 14, with a composition of, for example, $Si_{0.75}Ge_{0.25}$, is grown on the surface of a silicon substrate 12. The first SiGe layer 14 is grown to a thickness that is greater than its critical thickness. Thereafter a silicon cap layer 16 is deposited on the first SiGe layer 14. The thickness of the silicon cap layer 16 is typically relatively thin, e.g., about 10-20% of the thickness of the first SiGe layer 14, so as to not restrict the relaxation of the SiGe layer 14. FIG. 1C depicts the device 10 after an ion implantation process 18 is performed to implant ions, such as argon. The purpose of implanting the ions is to generate relatively "weak points" in the substrate 12 for nucleation of dislocations later in the process flow, i.e., so that formation of misfit dislocations and threading dislocations in the first SiGe layer 14 may be easier to generate. FIG. 1D depicts the device 10 after an anneal process (e.g., 750-1050° C.) is performed that results in the formation of misfit dislocations at the interface between the substrate 12 and the first SiGe layer 14 (dislocation not shown) and simplistically depicted threading dislocations 26 that extend through the first SiGe layer 14. Some of the threading dislocations in the first SiGe layer 14 will also annihilate with dislocations of opposite sign. Those threading dislocations that are not annihilated would ideally terminate at the upper interface with the silicon cap 16. In other words, ideally all of the threading dislocations 26 will be trapped in the first SiGe layer 14 and not penetrate into the silicon cap layer 16. At this point in the process, the first SiGe layer 14, which was originally strained when formed, is now relaxed with dislocations, while the silicon cap layer 16 is in a tensile strained condition with the same lateral lattice parameter of the now-relaxed first SiGe layer 14. FIG. 1E depicts the device 10 after a second silicon germanium layer of material 28 was formed on the silicon cap layer 16. In theory, since the first SiGe layer 14 is now relaxed, substantially all of the threading dislocations 26 were trapped under or at the interface with the silicon cap layer 16, and the silicon cap layer 16 itself is substantially free of threading dislocations, the second SiGe layer 28 may be grown to any desired thickness in a substantially dislocation-free condition if it has the same germanium composition as the first silicon germanium layer 14, e.g., $Si_{0.75}Ge_{0.25}$. Thereafter, although not depicted in the drawings, additional epitaxial semiconductor material (Si for N-type devices and $SiGe_{0.5}$ for P-type devices) may be grown on the second SiGe layer 28 using appropriate masking strategies if needed.

While the above-described process has been somewhat successful in producing SRB structures with low TDD values, the quality of such SRB structures is still not sufficient to provide virtual substrates for future generation transistor devices. Ideally, the SRB structure would be formed with zero threading dislocations, but, as a practical matter, there will always be some threading dislocations present in the SRB structure. As it relates to the formation of such SRB structures for future device generations, a target goal would be to achieve a TDD of nearly zero. The above-described process flow (FIGS. 1B-1E) typically results in a TDD of about $1 \times 10^4$ dislocations/cm$^2$.

It is believed that the above-described process flow for forming the SRB structure is not as effective as would otherwise be desired for several reasons. First, during the ion implantation process 18 (FIG. 1C), the distribution of the implanted ions does not result in a very small vertical distribution of ions centered at the interface 20 between the substrate 12 and the first SiGe layer 14. Rather, due to straggle in the ion implantation process 18, some of the implanted ions are vertically distributed throughout the thickness of the first SiGe layer 14, some may be positioned at the silicon cap layer 16, and some may be positioned in the silicon substrate 12. As a result, the threading dislocations may originate and propagate into or through the silicon cap layer 16. If so, such dislocations will also propagate into the second SiGe layer 28 when it is formed. Second, in some cases, the silicon cap layer 16 is simply not effective in trapping all of the dislocations as some of the dislocations propagate to the surface of the silicon cap layer 16. Such a situation may arise when an aggressive anneal process 24 is performed to cause the formation of the threading dislocations 26. FIG. 1F is a TEM photograph depicting the propagation of dislocations through the silicon cap layer 16 and into the second silicon germanium layer of SiGe material.

The present disclosure is directed to various methods of forming strained epitaxially grown semiconductor material(s) above a strain-relaxed buffer (SRB) layer that solves or reduces one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming epitaxially grown semiconductor materials above a strain-relaxed buffer (SRB) layer. One illustrative method disclosed herein includes, among other things, performing a plurality of epitaxial deposition processes to sequentially form a first material layer on a semiconductor substrate, a first capping layer on the first material layer, a second material layer on the first capping layer and a second capping layer on the second material layer, wherein the first and second material layers are made of semiconductor material having a lattice constant that is different than a lattice constant of the semiconductor substrate, the first layer is strained as deposited, and a thickness of the first material layer exceeds a critical thickness required to be stable and strained. The method also includes the steps of, after forming the second material layer, performing an anneal process after which the strain in the first material layer is substantially relaxed through the formation of crystallographic defects that are substantially confined to the semiconducting substrate, the first material layer, the first capping layer and the second material layer and, after performing the anneal process, forming additional epitaxial semiconductor material on an upper surface of the resulting structure.

BRIEF DESCRIPTION OF THE DRAWINGS

The disclosure may be understood by reference to the following description taken in conjunction with the accompanying drawings, in which like reference numerals identify like elements, and in which.

Figure 1A:
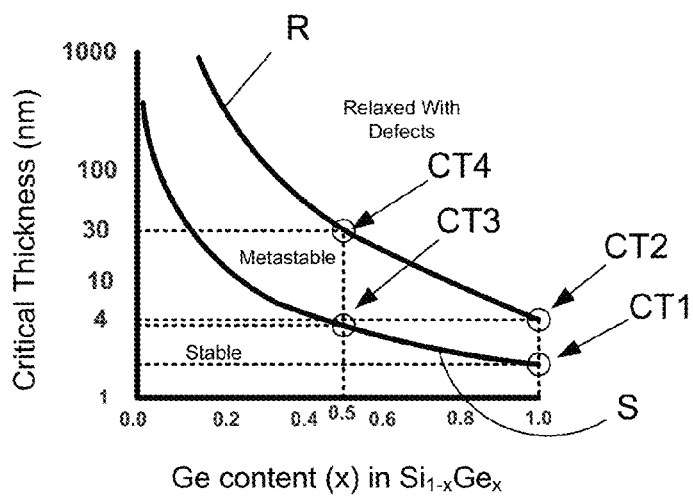
FIGS. 1A-1F depict the formation of an SRB structure using an illustrative prior art processing technique.
Figure 1B:
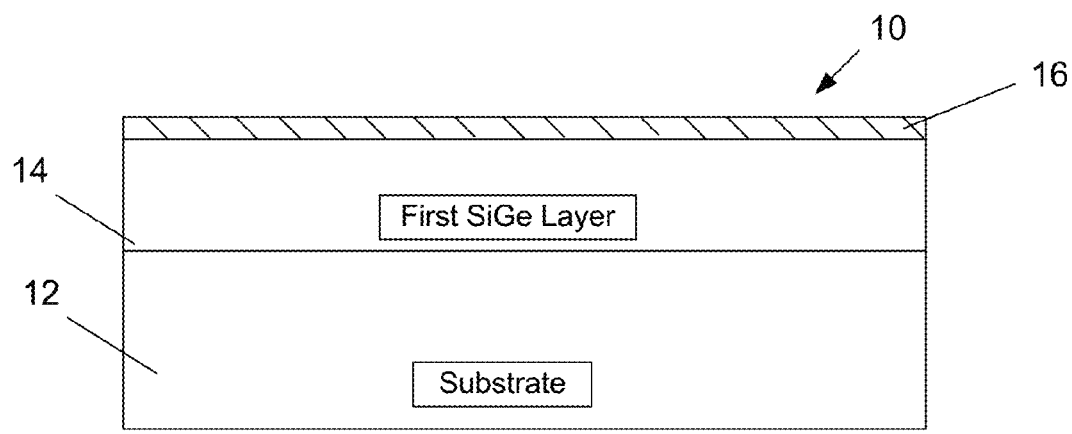
Figure 1C:
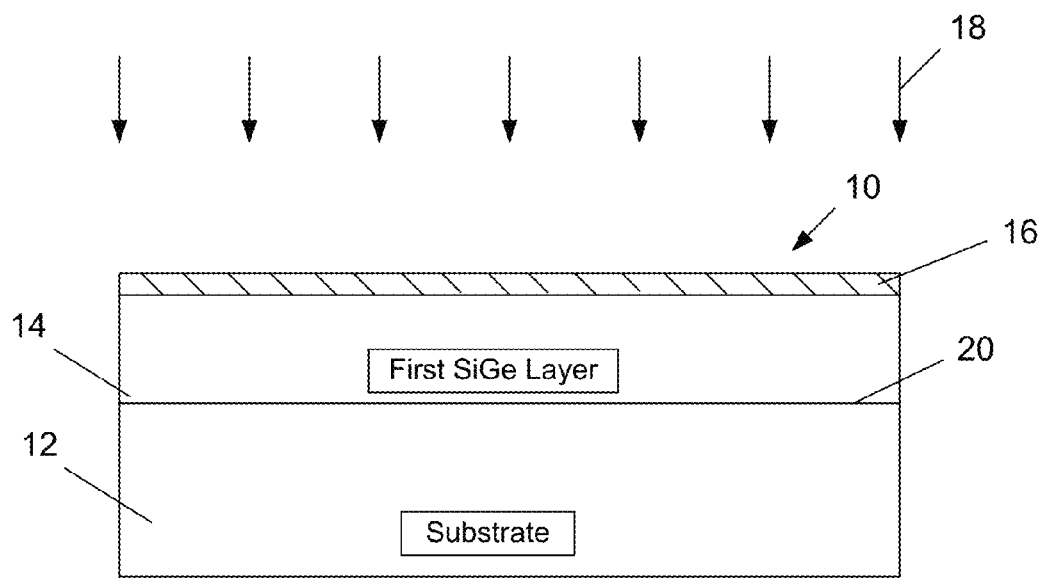
Figure 1D:
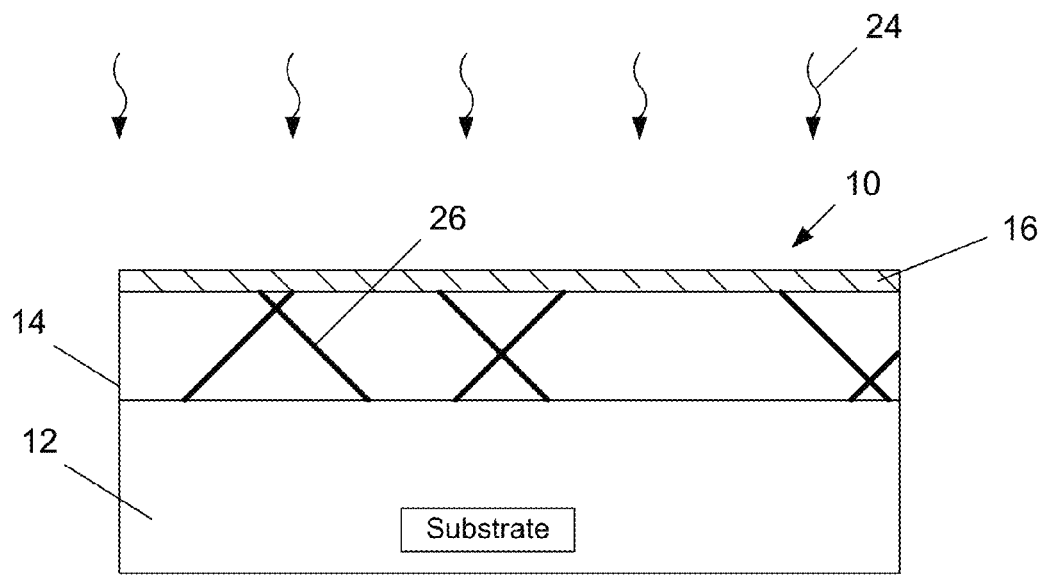
Figure 1E:
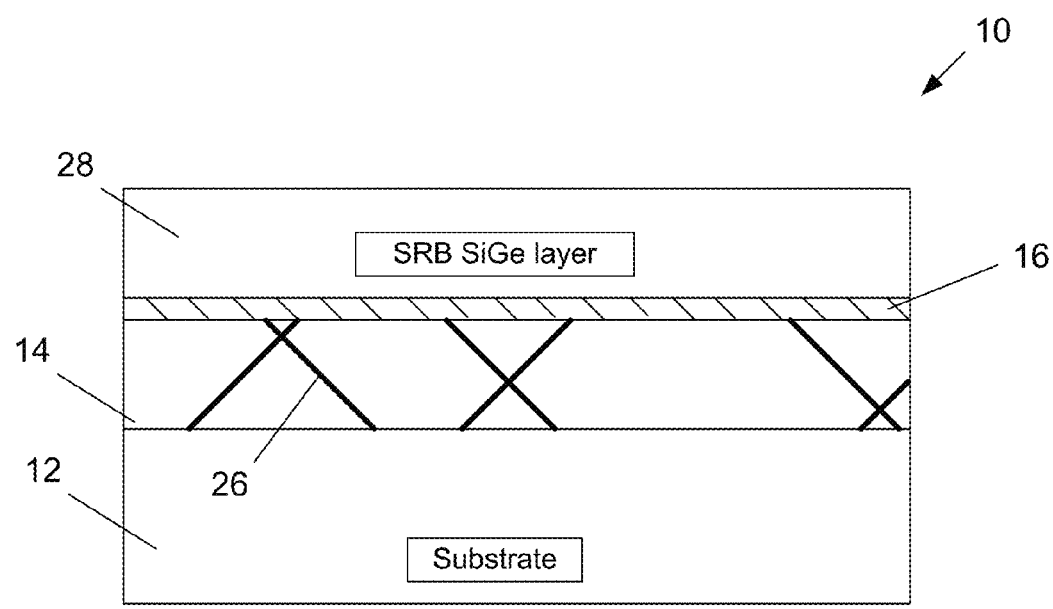
Figure 1F:
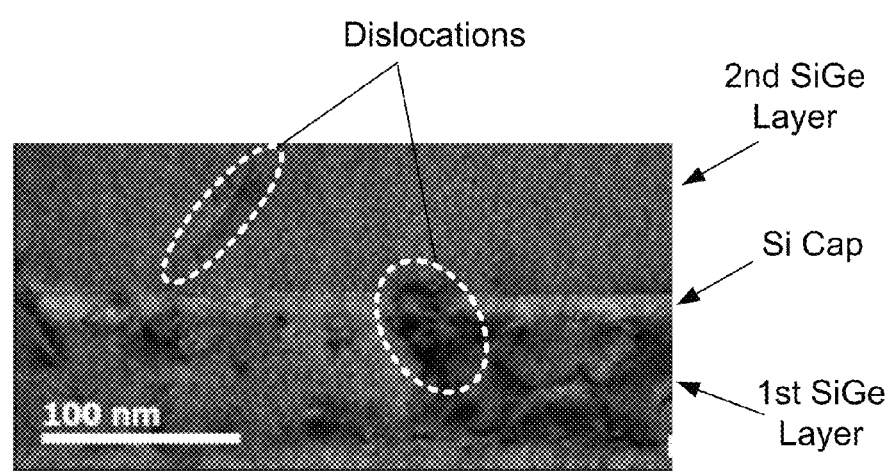

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIGS. 2A-2E depict one illustrative method disclosed herein of forming strained epitaxially grown semiconductor material(s) above a strain-relaxed buffer (SRB) layer. The inventions herein will be disclosed in the context of forming an SRB structure above a semiconducting substrate 102. The illustrative substrate 102 may be a bulk semiconductor substrate, or it may be the active layer of a so-called SOI (silicon-on-insulator) substrate or a so-called SGOI (silicon/germanium on insulator) substrate. Thus, the terms "substrate," "semiconductor substrate" or "semiconducting substrate" should be understood to cover all semiconductor materials and all forms of such semiconductor materials. In one embodiment, the substrate 102 may be a (100) silicon substrate.

Figure 2A:
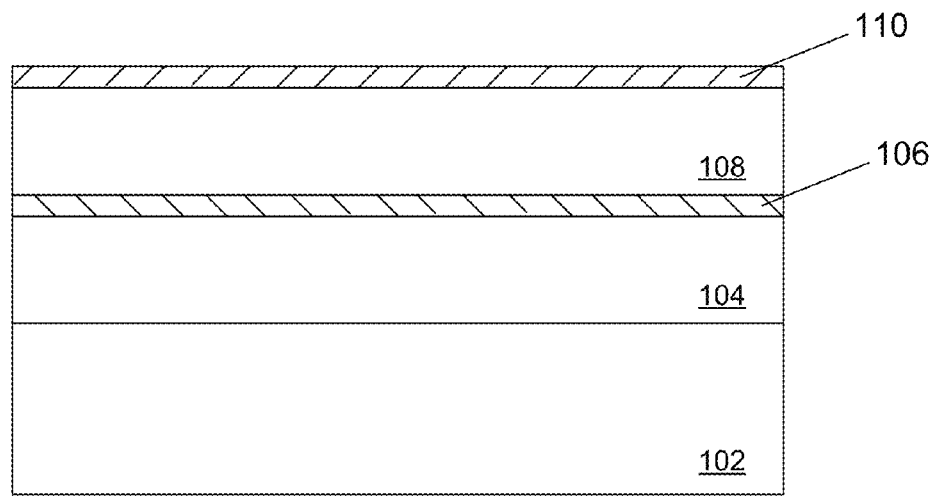
FIGS. 2A-2E depict one illustrative method disclosed herein of forming strained epitaxially grown semiconductor material(s) above a strain-relaxed buffer (SRB) layer.

At the point of fabrication depicted in FIG. 2A, a first material layer 104, a first capping layer 106, a second material layer 108 and a second capping layer 110 are sequentially formed above the substrate 102. The layers 104, 106, 108 and 110 are all made of semiconductor materials and they are all formed by performing known epitaxial growth processes. In one illustrative embodiment, the layers 104, 106, 108 and 110 are sequentially formed in the same process tool without breaking vacuum, i.e., without exposing the materials to air. In general, the layers 104 and 108 are made of a material that has a different lattice constant than the lattice constant of the substrate 102 and they are deposited in a strained condition.

The materials used for the material layers 104 and 108 and the capping layers 106 and 110 may vary depending upon the particular application. In some applications, the material layers 104, 108 may be made of the same material (e.g., $Si_{0.75}Ge_{0.25}$). In one illustrative embodiment, the material layers 104, 108 may both be made of a silicon-germanium material wherein germanium composition ranges from 10-50%. In one particular embodiment, the material layers 104, 108 may both have substantially the same germanium composition. In yet another example, the germanium composition in the first material layer 104 is at least about 5 atomic percent greater than the germanium composition of the second material layer 108. For this particular embodiment, the higher germanium concentration in the first material layer 104 than in the second material layer 108 provides a higher strain energy in the first material layer 104 and induces the crystallographic defects to be predominantly formed in the first material layer 104 and results in fewer defects in the second material layer 108. In some applications, the capping layers 106, 110 may be made of the same material (e.g., Si), but such a situation is not required in all applications. In one particular embodiment, the one or more of the capping layers has a composition that is at least 90 atomic percent silicon. In one particular example, the material layers 104, 108 are made of $Si_{0.75}Ge_{0.25}$, while the capping layers 106, 110 are made of silicon.

The thickness of the material layers 104, 108 and the capping layers 106 and 110 may vary depending upon the particular application. In one embodiment, each of the layers 104, 108 is grown to a thickness that is greater than the critical thickness of the material of the layers 104, 108 required to be stable and strained. In another embodiment, the first and second material layers 104, 108 have substantially the same lattice constant and the thickness of the first material layer 104 is at least 25% greater than a thickness of the second material layer 108. In this embodiment, the increased strain energy in the first material layer 104 as compared to the second material layer 108 induces the first material layer 104 to relax preferentially and results in the predominance of crystallographic defects in the first material layer 104 and lower defect levels in the second material layer 108. In general, the capping layers 106, 110 may be formed to the same or different thicknesses depending upon the application. For example, the first capping layer 106 may have a thickness that falls within the range of about 2-20% of the first material layer 104. The thickness of each of the cap layers 106 and 110 is typically relatively thin with respect to its underlying material layer 104, 108, respectively, e.g., the layers 106, 110 may have a thickness that is equal to about 2-20% of the thickness of the underlying material layers 104, 108 so as to not restrict the later relaxation of the layers 104, 108 and so as to be below its critical thickness.

Figure 2B:
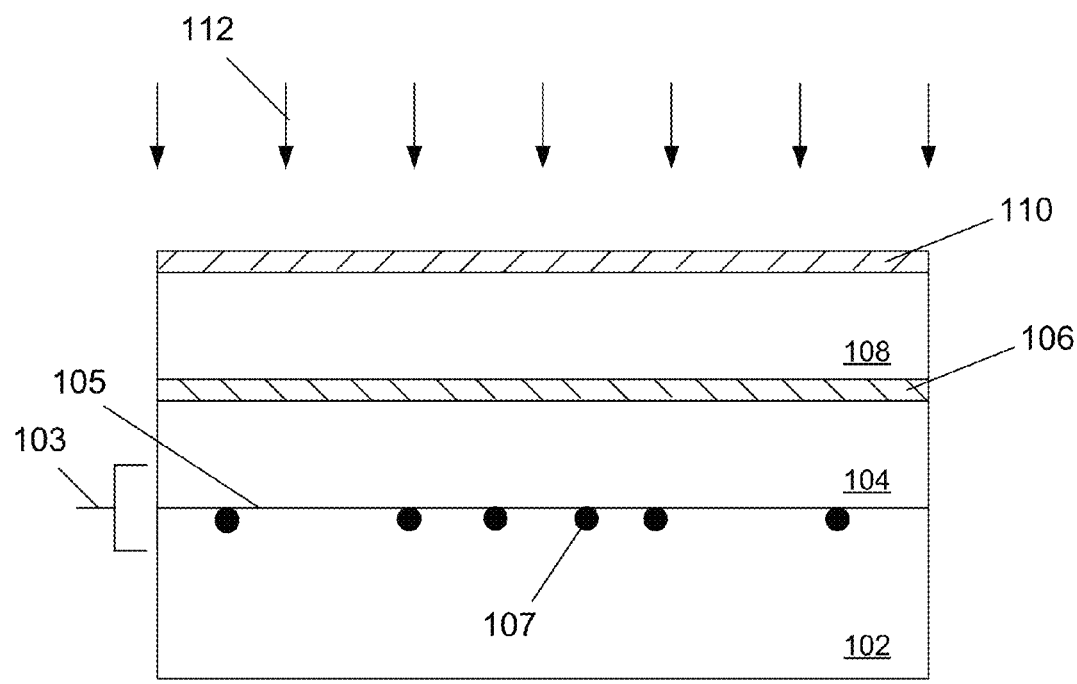

FIG. 2B depicts the device after an ion implantation process 112 was performed to implant ions, such as argon, germanium, silicon, phosphorus, arsenic, fluorine, krypton and/or xenon, etc., into the structure through the layers 110, 108, 106 and 104. The implant dose and implant energy may vary depending upon the application, but generally the implantation process will be performed under conditions so as to not amorphize the crystalline structure of the materials. For example, the dose during the implant process 112 could be at least about $5 \times 10^{11}$ atoms/cm$^2$, a dose that is below the amorphization threshold for the first material layer 104. Ideally, the implant energy of the ion implantation process 112 is selected so as to produce an implant region 103 wherein a peak concentration of the as-implanted species is located approximately 15 nm (below or above) the interface 105 between the substrate 102 and the first material layer 104. The purpose of implanting the ions is to generate simplistically depicted point defects 107—interstitials or vacancies—in the substrate 102 so that formation of misfit dislocations and threading dislocations in the first material layer 104 may be easier to generate.

Figure 2C:
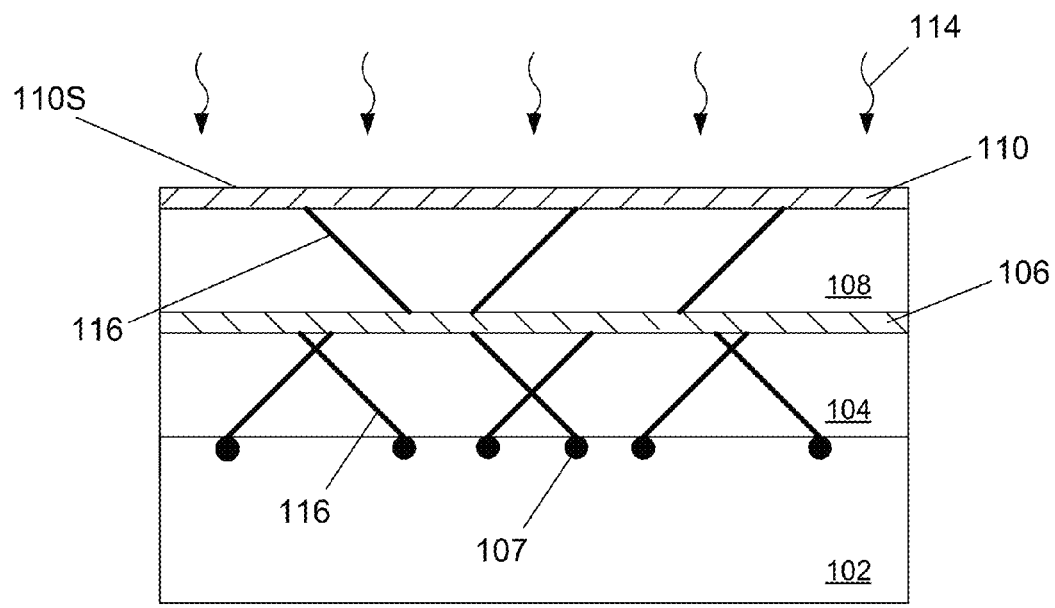
Figure 2D:
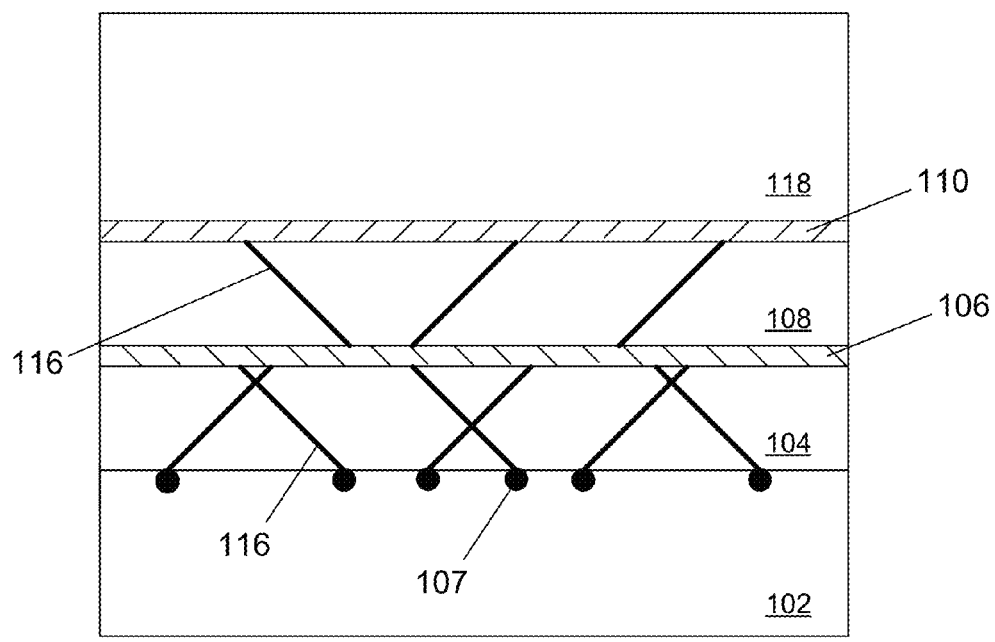

FIG. 2C depicts the structure after an anneal process 114 (e.g., 750-1050° C.) was performed so as to form the simplistically depicted threading dislocations 116 that extend through the first material layer 104 and perhaps through the second material layer 108. In general, performing the anneal process 112 causes a substantial reduction in the strain in the first material layer 104 through the formation of crystallographic defects, such as dislocations and stacking faults, where these defects are substantially confined to the semiconducting substrate 102, the first material layer 104 and the first capping layer 106. Due to the presence of the additional layer of material 108 and the upper capping layer 110, propagation of the threading dislocations 116 into the upper capping layer 110 and to the surface 110S of the upper capping layer 110 is more difficult as compared to prior art processing techniques. Accordingly, the upper surface 110S of the upper capping layer 110 should be substantially free of threading dislocations. At this point in the process, the layers 104, 108 are each in a relaxed with dislocations condition.

Figure 2E:
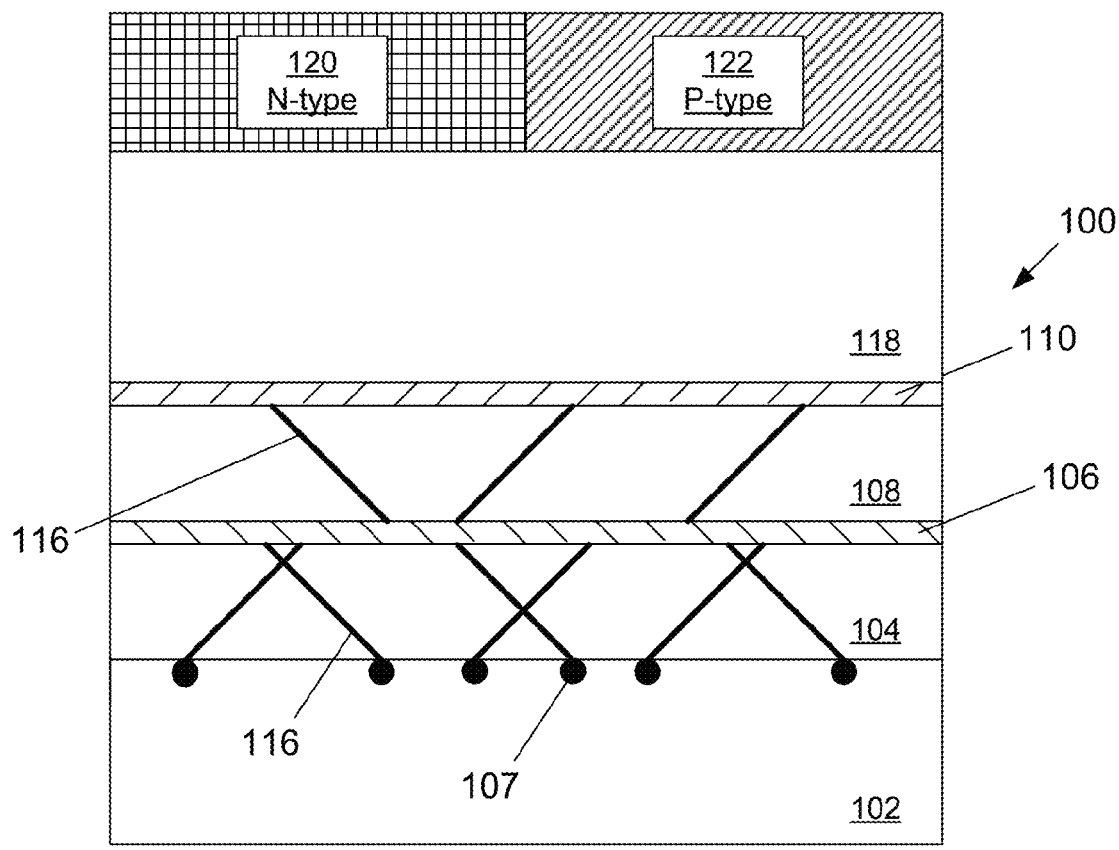

FIG. 2E depicts the device after a substantially dislocation-free SRB layer 118 was formed on the underlying structure, i.e., above the upper surface of the upper capping layer 110. By use of the phrase "substantially free of threading dislocations" here and in the claims, it is meant that the threading dislocation density (TDD) is $1 \times 10^3$ dislocations/cm$^2$ or less. The SRB layer 118 may be comprised of a variety of different materials. In one illustrative embodiment, the SRB layer 118 may be made of $Si_{0.75}Ge_{0.25}$. The SRB layer 118 may be grown to any desired thickness in a substantially dislocation-free condition.

FIG. 2E simplistically depicts the formation of additional epitaxial semiconductor material 120 for N-type devices (e.g., Si) and additional epitaxial semiconductor material 122 for P-type devices (e.g., $Si_{0.5}Ge_{0.5}$) on the SRB layer 118. The additional epitaxial semiconductor materials may be grown on the SRB layer 118 using appropriate masking strategies if needed. The additional epitaxial materials 120, 122 may be grown to any desired thickness in a substantially dislocation-free condition using the methods disclosed herein.

FIGS. 3A-3E depict another illustrative method disclosed herein of forming strained epitaxially grown semiconductor material above a strain-relaxed buffer (SRB) layer. At the point of fabrication depicted in FIG. 3A, the above-described first layer 104 and first capping layer 106 were sequentially formed above the substrate 102.

Figure 3A:
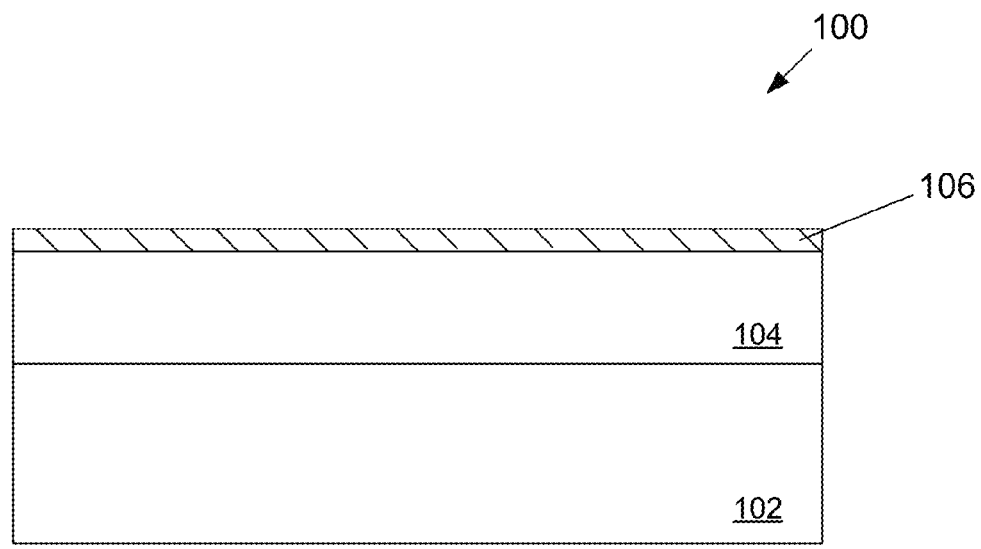
FIGS. 3A-3E depict another illustrative method disclosed herein of forming strained epitaxially grown semiconductor material(s) above a strain-relaxed buffer (SRB) layer.
Figure 3B:
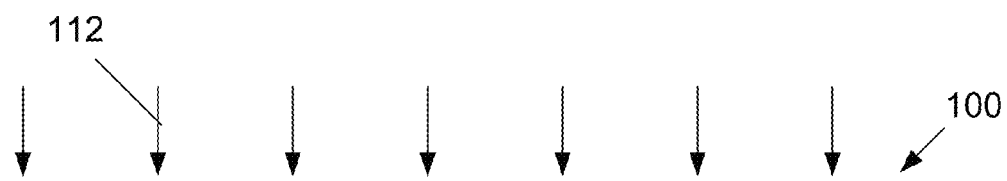
Figure 3B:
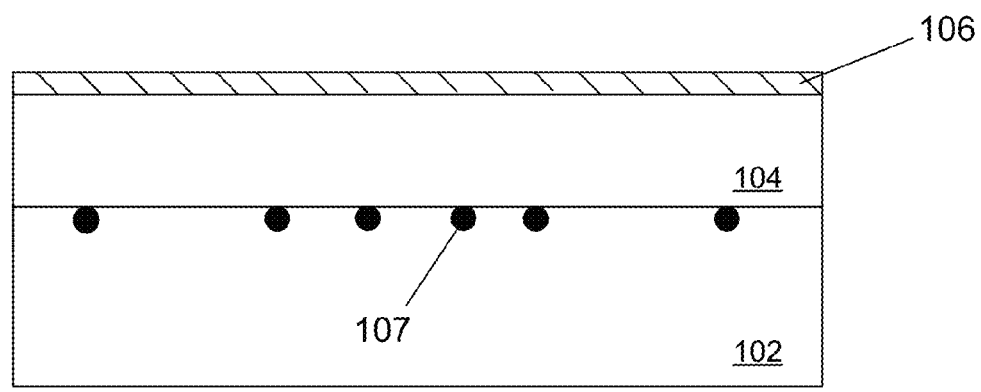

FIG. 3B depicts the device after the above-described ion implantation process 112 was performed to implant ions, such as argon, germanium, silicon, phosphorus, arsenic, fluorine, krypton and/or xenon, etc., into the structure through the layers 106 and 104 so as to generate the simplistically depicted point defects 107 in the substrate 102. As before, the implant dose and implant energy may vary depending upon the application, but as before, the implantation process will be performed under conditions so as to not amorphize the crystalline structure of the materials.

Figure 3C:
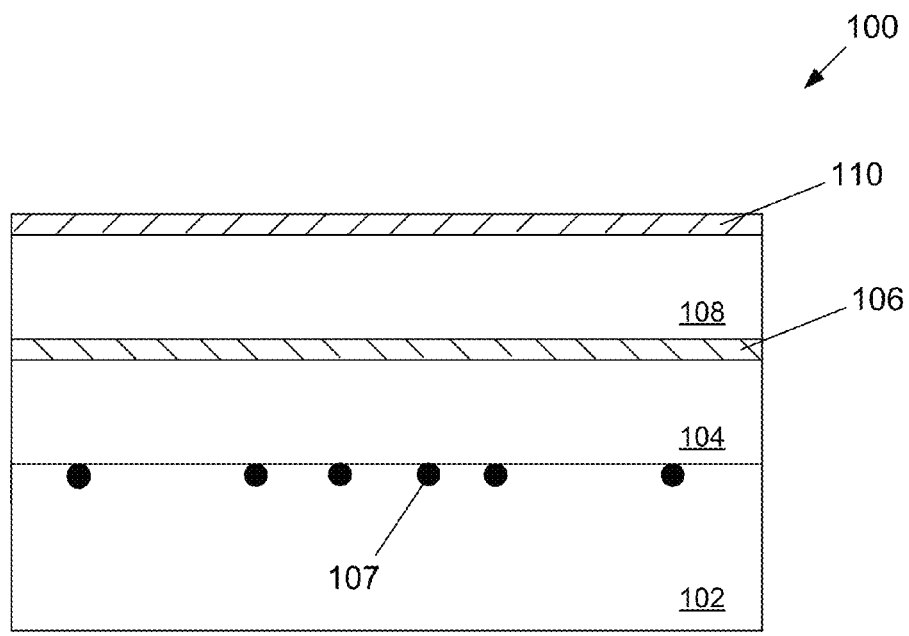

FIG. 3C depicts the device after the above-described layers 108 and 110 were formed on the device. It should be noted that, at this point in the process flow, the layers 104 and 106 may have point defects 107 created therein due to the above-described ion implantation process, but the material layers 108 and 110 should be substantially free of such point defects 107, as depicted.

Figure 3D:
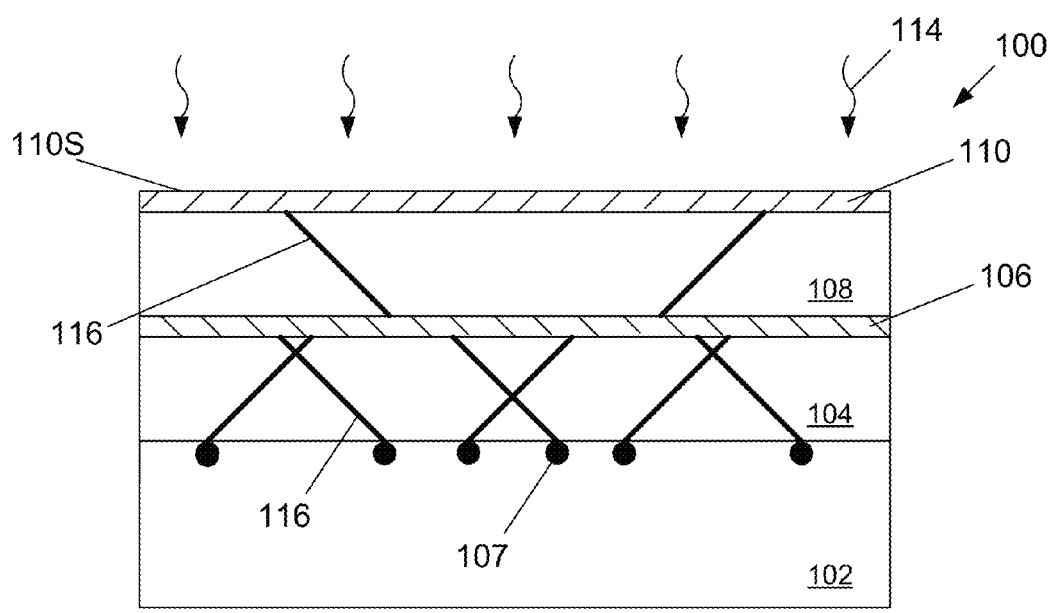

FIG. 3D depicts the device after the above-described anneal process 114 was performed so as to form the simplistically depicted threading dislocations 116 that extend through the first layer 104 and perhaps through the layer 108. As before, due to the presence of the additional layer of material 108 and the upper capping layer 110, propagation of the threading dislocations 116 into the upper capping layer 110 and to the surface 110S of the upper capping layer 110 is more difficult as compared to prior art processing techniques. Moreover, in this embodiment, since the layers 108 and 110 were not exposed to the ion implantation process 112, there is less likelihood for the creation of point defects 107 in the layers 108, 110. Accordingly, this would reduce the chances of any threading dislocation being generated in the layers 108 and/or 110. As a result, the upper surface 110S of the upper capping layer 110 should be substantially free of threading dislocations. At this point in the process, the layers 104, 108 are each in a relaxed with dislocations condition.

Figure 3E:
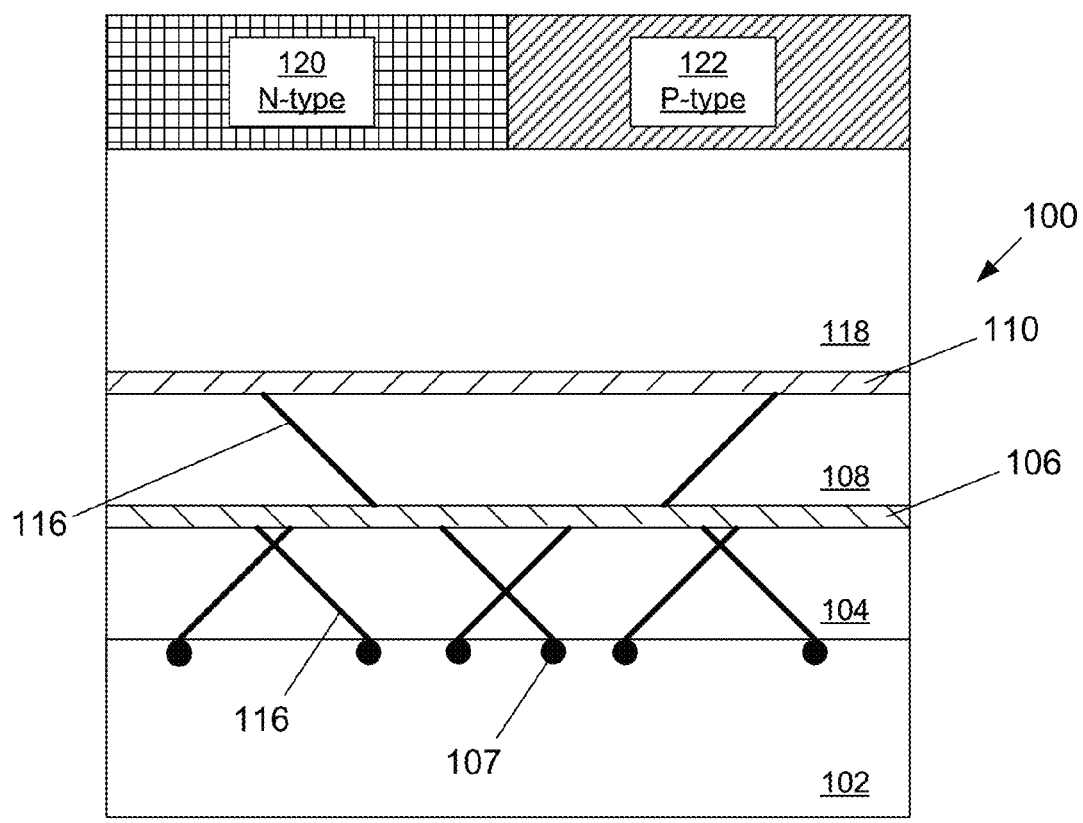

FIG. 3E depicts the device after the formation of the above-described substantially dislocation-free SRB layer 118 on the upper surface of the upper capping layer 110, and after the formation of the above-described additional epitaxial semiconductor materials 120, 122.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

performing a plurality of epitaxial deposition processes to sequentially form a first silicon germanium layer directly on a silicon layer of a silicon substrate or a silicon-on-insulator substrate and a first silicon capping layer on said first silicon germanium layer, a thickness of said first silicon germanium layer exceeds a critical thickness required to be stable and strained;

after forming said first silicon capping layer, performing an ion implantation process so as to introduce implanted ions at least at a location near an interface between said first silicon germanium layer and said silicon or silicon-on-insulator substrate;

after performing said ion implantation process, performing a second plurality of epitaxial deposition processes to sequentially form a second silicon germanium layer on said first silicon capping layer and a second silicon capping layer on said second silicon germanium layer;

after forming said second silicon capping layer, performing an anneal process so as to form crystallographic defects that are substantially confined to said silicon substrate, said first silicon germanium layer, said first silicon capping layer, and said second silicon germanium layer; and after performing said anneal process, forming additional epitaxial semiconductor material on an upper surface of the resulting structure.

2. The method of claim 1, wherein said first and second silicon germanium layers have substantially the same germanium composition, and wherein said germanium composition is in the range between about 20 and about 50 atomic percent.

3. The method of claim 1, wherein the thickness of said first silicon germanium layer is at least 25% greater than a thickness of said second silicon germanium layer.

4. The method of claim 1, wherein the germanium composition of said first silicon germanium layer is at least 5 atomic percent greater than the germanium composition of said second silicon germanium layer.

5. The method of claim 1, wherein a thickness of said first silicon capping layer is between 2 and 20 percent of the thickness of said first silicon germanium layer.

6. The method of claim 1, wherein said anneal process is performed at a temperature that falls within the range of about 750-1050° C.

7. The method of claim 1, wherein said ion implantation process is performed using at least one of silicon, germanium, boron, phosphorus, arsenic, fluorine, argon, krypton and/or xenon.

8. The method of claim 1, wherein said ion implantation process is performed with an implant energy that is chosen so as to result in a region of as-implanted species with a peak concentration of said as-implanted species located within about 15 nm of an interface between said silicon or silicon-on-insulator substrate and said first silicon germanium layer.

* * * * *